(12) United States Patent
Hemink

(10) Patent No.: US 7,304,893 B1
(45) Date of Patent: Dec. 4, 2007

(54) METHOD OF PARTIAL PAGE FAIL BIT DETECTION IN FLASH MEMORY DEVICES

(75) Inventor: Gerrit Jan Hemink, Yokohama (JP)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/428,083

(22) Filed: Jun. 30, 2006

(51) Int. Cl.
G11C 11/34 (2006.01)

(52) U.S. Cl. .......................... 365/185.22; 365/185.09; 365/185.29

(58) Field of Classification Search ........... 365/185.18, 365/185.09, 185.17, 185.22, 185.29
See application file for complete search history.

(56) References Cited

U.S. PATENT DOCUMENTS

| | | | |
|---|---|---|---|
| 5,172,338 A | 12/1992 | Mehrotra et al. | |
| 6,222,762 B1 | 4/2001 | Guterman et al. | |
| 6,515,910 B1* | 2/2003 | Lee et al. | 365/185.22 |
| 6,522,580 B2 | 2/2003 | Chen et al. | |
| 6,747,892 B2 | 6/2004 | Khalid | |
| 6,888,758 B1 | 5/2005 | Hemink et al. | |
| 6,944,072 B2* | 9/2005 | Micheloni et al. | 365/200 |
| 6,972,993 B2 | 12/2005 | Conley et al. | |
| 2003/0002348 A1 | 1/2003 | Chen et al. | |
| 2003/0123286 A1 | 7/2003 | Higuchi | |
| 2003/0174555 A1 | 9/2003 | Conley et al. | |
| 2004/0109362 A1 | 6/2004 | Gongwer et al. | |
| 2004/0174748 A1 | 9/2004 | Lutze et al. | |
| 2004/0255090 A1 | 12/2004 | Guterman et al. | |
| 2005/0125708 A1 | 6/2005 | Simon | |

OTHER PUBLICATIONS

Eitan et al., "4-Bit-Per-Cell NROM Reliability", International Electron Device Meeting (IEEE, 2005).

* cited by examiner

*Primary Examiner*—Son Dinh
*Assistant Examiner*—Hien Nguyen
(74) *Attorney, Agent, or Firm*—Anderson, Levine & Lintel

(57) ABSTRACT

A flash memory device, and a method of operating the same, is disclosed. The array of the flash memory device is arranged in pages of memory cells, each page having memory cells associated into groups of memory cells within the page for purposes of fail bit detection in program verification. For example, these groups may correspond to sectors within the page. In a programming operation, the verify process determines whether each group of memory cells within the page has fewer than a selected ignore bit limit for the sector. If not, additional programming is required for the insufficiently programmed cells in the page. By applying a fail bit detection threshold for each of multiple groups within the page, the efficiency of error correction coding in the flash memory is improved. A similar verify and fail bit detection approach may be used in erase and soft programming operations.

19 Claims, 7 Drawing Sheets

METHOD OF PARTIAL PAGE FAIL BIT DETECTION IN FLASH MEMORY DEVICES

CROSS-REFERENCE TO RELATED APPLICATIONS

This application is related to copending application Ser. No. 11/428,111, entitled "Partial Page Fail Bit Detection in Flash Memory Devices", which is commonly assigned with, and has the same filing date as, this application.

STATEMENT REGARDING FEDERALLY SPONSORED RESEARCH OR DEVELOPMENT

Not applicable.

BACKGROUND OF THE INVENTION

This invention is in the field of solid-state non-volatile memory, and is more specifically directed to the detection of failed memory cells in such memory.

As well known in the art, "flash" memories are electrically-erasable and rewritable semiconductor memory devices that can be erased at once (in a "flash") on a chip-wide basis, or in smaller units referred to as blocks. As such, flash memory has become especially popular for applications in which non-volatility (i.e., data retention after removal of power) of the stored data is essential, and in which rewriting of the data is required, but where the frequency of such rewriting is relatively low. Popular applications of flash memory include portable audio players, "SIM" card storage of telephone numbers and phone activity in cellular telephone handsets, "thumbkey" removable storage devices for computers and workstations, storage devices for digital cameras, and the like.

An important recent advance in semiconductor non-volatile memory technology is the arrangement of the flash memory cells as "NAND" memory rather than as "NOR" memory. As known in the art, NOR flash memory refers to the conventional arrangement of a column of memory cells in parallel between a bit line and a source line. Access of a specific cell in a NOR column is made by driving its word line (control gate) active while holding the other cells in the column off, so that the current between the bit line and source line is determined by the state of the accessed cell. Memory cells in a column of NAND memory, on the other hand, are connected in series between the bit line and the source line. Accessing of a specific cell in a NAND column thus requires turning on all of the cells in the column with active word line levels, and applying an intermediate word line level to the cell to be accessed, such that the current between the bit line and source line is, again, determined by the state of the accessed cell. As well known in the art, the chip area required per bit of NAND flash memory is much reduced from the area per bit of NOR flash memory, primarily because fewer conductors (and therefore contacts) are required for a column of NAND memory relative to NOR memory; in addition, access transistors can be shared among a large number of cells in the NAND arrangement. Additionally, conventional NAND flash memory is conveniently accessed serially, for example by sequentially accessing the contents of cells sharing a word line (i.e., within a row), rather than as a random access memory as in the case of NOR memory. NAND memory is thus especially well-suited for storing music and video, and for other file storage applications.

Another important recent advance in the field of flash memory is referred to in the art as the multilevel cell (MLC). According to this approach, more than two data states are made possible for each memory cell, simply by more finely controlling the programming of the cell. In conventional binary data storage, each memory cell is programmed into either a "0" or a "1" state. Reading of such binary cells is accomplished by applying a single control voltage to the control gate of the addressed memory cell so that the transistor conducts if programmed to a "1" state, but remains off in the "0" state; sensing of the conduction through the addressed memory cell thus returns the programmed state of the cell. In contrast, according to a typical example of the MLC approach, four possible states are defined for each memory cell, typically corresponding to binary values 00, 01, 10, 11. In effect, the two intermediate states correspond to two levels of partial programming of the cell between the fully erased and fully programmed states. Some implementations of MLC flash memory with up to eight possible states, or three bits, per cell are known. The ability to store two or three bits of data on each memory cell of course doubles or triples the data capacity of a flash memory chip for a given number of memory cells. Examples of MLC flash memory cells and memories including such MLC cells are described in U.S. Pat. No. 5,172,338, and U.S. Pat. No. 6,747,892 B2, both commonly assigned herewith and incorporated herein by this reference.

The combination of MLC technology with the efficiencies of NAND flash memory architectures has resulted in significantly reduced cost per bit for semiconductor non-volatile storage, as well as improved system reliability, and a higher data capacity and system functionality for a given form factor.

Modern flash memory devices, particularly those of the NAND architecture and involving MLC cells, are arranged in "blocks" and "pages". A block refers to an erase unit, and defines a group of cells that are simultaneously erased in a single erase operation. Typically, a block of cells is smallest group of cells that can be erased. A page refers to a programming unit, and defines a group of cells that are simultaneously programmed, or written, in a single programming operation. Each block typically includes multiple pages. Generally, the arrangement of cells into pages and blocks is based on the physical realization of the memory array. For example, in many NAND memory arrays, a page of memory cells is defined by those cells that share the same word line, and a block is defined by those pages residing in the same "NAND" chain. For example, if a NAND chain includes thirty-two memory cells in series, a block will typically include thirty-two pages, or an integer multiple of thirty-two pages. In some NAND memory arrays, one word line can be shared by cells for two pages; the data for a first page is stored in the cells of even-numbered columns, while the data for a second page is stored in the cells of odd-numbered columns along that word line. Other arrangements are also possible. Conventional MLC flash memories are often configured so that one physical page corresponds to two or more logical pages, each logical page corresponding to one of the bit positions of the multiple-bit data. For example, in a four-state MLC memory array, each physical page will store data for two logical pages, which are referred to as the "upper" and "lower" pages.

Historically, the organization of data stored in a flash memory has followed the file systems used in connection with magnetic disk storage, and as such is based on "sectors". A sector is typically a group of data of a fixed size, for example, 512 bytes of user data plus some number of bytes of overhead. In many modern file systems, the operating system of the computer or other host system arranges data into sectors, and writes data to and reads data from non-volatile storage on a sector-by-sector basis. To permit convenient use of flash memory devices as non-volatile storage devices in such systems and applications, many modern flash memories handle data in a similar fashion, mapping logical "sector" addresses to physical addresses in the flash memory array.

In recent years, the sizes and capacities of flash memory devices have greatly increased, resulting in memory arrays of more than 4 billion cells. In such arrays, a single word line may extend to over 32000 memory cells, placing that many memory cells within the same page, or programming unit. In such large scale flash memories, therefore, each page now includes multiple sectors. As such, the units of data handled by the host system (i.e., "sectors") are smaller than the smallest programming unit in the flash memory device. Typically, however, the multiple sectors of data that comprise a page of the flash memory will be sequentially communicated to the flash memory, and will be simultaneously programmed into a page of the flash memory in a single operation.

By way of further background, the use of error correction coding (ECC) in mass data storage devices and storage systems, as well as in data communications systems, is well known. As fundamental in this art, error correction coding involves the storage or communication of additional bits (commonly referred to as parity bits, code bits, checksum digits, ECC bits, etc.) that are determined or calculated from the "payload" data bits being encoded. For example, the storage of error correction coded data in a memory resource involves the encoding of a code word including the actual data and the additional code bits, using a selected code. Retrieval of the stored data involves the decoding of the stored code word according to the same code as used to encode the stored code word. Because the code bits "overspecify" the actual data portion of the code word, some number of errored bits can be tolerated, without any loss of actual data evident after decoding.

Many ECC coding schemes are well known in the art. These conventional error correction codes are especially useful in large scale memories, including flash memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others; generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other BCH codes, Hamming codes, and the like. Typically, the error correction codes used in connection with flash memory storage are "systematic", in that the data portion of the eventual code word is unchanged from the actual data being encoded, with the code or parity bits appended to the data bits to form the complete code word.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four errored bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits.

In the flash memory context, error correction coding provides substantial improvement in manufacturing yield, as well as in the reliability of the flash memory over time. These improvements are attained at a cost of the additional memory cells required for storing the ECC or parity bits (rather than storing actual data). Error correction coding is especially beneficial in flash memories, considering that flash memory cells degrade as the result of "wear" from previous programming and erase cycles. In addition, flash memories of the MLC type especially benefit from error correction coding, because of the narrow threshold voltage margins required to resolve more than two logic states from each memory cell.

By way of further background, the programming and erasing of conventional flash memory devices now typically involves the verification of the state of the memory cells being programmed or erased, to ensure that the desired state has been reached for each of the cells subject to the operation. Indeed, considering that the programming and erasing of flash memory cells are typically performed by the application of a sequence of pulses of the appropriate voltages, and also considering that the pulse sequences consume substantial time and power, many flash memories now include verification operations during the programming or erasing operations themselves. For example, the programming of a page of memory cells is typically performed by applying a programming pulse, and then verifying the programmed cells against a desired "verify" voltage for the data level being programmed. If not all of the memory cells verify to the desired level after a first pulse, the programming pulse is repeated (often at a higher voltage), and the cells are verified again. Upon all of the memory cells reaching the desired program level, the programming operation is terminated.

Verification is also typically performed in the erasing of a block of flash memory cells, with additional erase pulses applied as necessary to ensure all cells are erased. In general, for NAND flash memories, erase verification is typically performed by applying a selected control gate voltage to all of the word lines of the block being erased, to determine whether any of the cells conduct at that control gate voltage. Because the threshold voltages of erased cells are typically below 0 volts, and because the application of negative word line voltages is not desirable, the verifying of negative erase voltages is often done by way of a low or zero voltage on the word lines, with the common source lines biased to effectively place a negative gate-to-source voltage at each memory cell in the NAND chain. The verify voltages typically differ from the control gate voltages applied in read cycles, to provide operating margin within the device. A similar approach is used for verifying the so-called "soft" programmed states of erased NAND cells; "soft" programming refers to the conventional operation of slightly programming erased flash memory cells, to prevent some or all of the cells from being too deeply erased.

In modern NAND flash memory devices that use floating-gate metal-oxide-semiconductor (MOS) transistors as memory cells, the programming operation involves the applying of a program voltage to the control gate of the transistor, and the grounding of its source-drain regions (i.e., the bit lines). This bias condition causes tunneling of electrons from the channel region through the gate dielectric and into the floating gate, where the electrons accumulate. The accumulated electrons negatively charge the floating gate, raising the threshold voltage of the memory cell (i.e., the voltage to which the control gate must be biased for conduction).

An example of a sequence of the program voltage pulses that are applied to the control gate of a flash memory cell is illustrated in FIG. 1a. As shown in FIG. 1a, the pulsed control gate voltage increases with each successive pulse by a predetermined step increment (e.g., 0.2 to 0.5 volts; of course, the step voltage can be larger or smaller than this range, depending on the application). After each programming pulse (or group of pulses, if desired), a verify operation is performed to determine whether each cell has been adequately programmed to the desired threshold voltage. This verify operation interrogates the programming level of each cell in the page being programmed (i.e., each cell that is intended to be programmed, depending on the input data) in parallel, to determine whether the threshold voltage of the cell is equal to or greater than a verify level corresponding to the data state being programmed. If not, that memory cell is subjected to an additional programming pulse or sequence of pulses.

A typical way of verifying programming is to test the conduction of each cell at a specific compare point that is set by a control gate voltage. Those cells that have previously been verified as sufficiently programmed are locked out, for example, by raising the bit line voltage for those cells in the page being programmed to a high level (e.g., the voltage of the $V_{dd}$ power supply), to stop the programming process for those cells. Those cells that are not yet sufficiently programmed receive the next higher voltage pulse in the programming sequence of FIG. 1a, followed by another verify operation.

For example, FIG. 1b presents plot 5 of threshold voltage $V_{th}$ over time, for a specific cell in a page being programmed by the pulse sequence of FIG. 1a. Plot 5 shows that the threshold voltage increases for this cell with each pulse of the programming voltage $V_{pgm}$ applied to its control gate. At time $t_1$, following a first pulse (or sequence of pulses) at programming voltage $V_{pgm}=V_1$, the threshold voltage $V_{th}$ has increased slightly from its unprogrammed (erased) state $V_e$, as shown in FIG. 1b. However, because this threshold voltage remains below the verify voltage $V_{verify}(1)$ for a "1" data state, which is the desired programmed state in this example. Accordingly, a second pulse (or sequence of pulses) are applied to this cell, at a slightly higher programming voltage $V_{pgm}=V_2$. Typically, the voltage step from one programming voltage $V_{pgm}$ level to the next (e.g., $V_2-V_1$) may be about 0.2 to 0.5 volts. The programmed cell is then again verified at time $t_2$, and the sequence continues. In the example of FIGS. 1a and 1b, the cell being programmed by the sequence of FIG. 1a reaches (and exceeds) the verify voltage $V_{verify}(1)$ for the desired data state at verify time $t_4$. This cell is then "locked out" from further programming as mentioned above, and does not receive the next higher programming voltage $V_{pgm}=V_5$. Other cells in the same page that are being programmed to this data state may receive additional pulses.

Additional description of programming and verification operations as known in the art are described in commonly assigned U.S. Pat. No. 6,888,758 B1, and in copending U.S. patent application Ser. No. 10/314,055, now published as U.S. Patent Application Publication No. 2004/0109362, both incorporated herein by this reference.

As is well known in this art, some memory cells are slower to program or erase than others, because of manufacturing variations among those cells, because those cells were previously erased to a lower threshold voltage than others, because of uneven wear among the cells within a page, or the like. And, of course, some cells cannot be programmed or erased whatsoever, because of a manufacturing defect. As mentioned above, error correction coding provides the capability of tolerating some number of slow or failed cells, while still maintaining the memory usable. In some applications, a page of data is programmed by repeatedly applying programming pulses until all memory cells on that page verify to the desired programmed state. In these applications, programming terminates if a maximum number of programming pulses is reached prior to successful verifying of the programmed page, following which the number of cells that have not yet been verified to the desired state is compared with a threshold value, which depends on the capability of the error correction coding that will be used in the reading of data from that page. In other applications in which the error correction is sufficiently robust, programming and erasing time is saved by terminating the sequence of programming or erasing pulses upon the number of slow (or failed) cells that are not yet fully programmed or erased being fewer than the number of bits that are correctable.

FIG. 2a illustrates the architecture of a conventional flash memory device, with reference to flash memory device 2, which includes the capability of performing verify operations during the programming and erasing of its memory cells. Within flash memory device 2, flash memory array 11 includes flash memory cells arranged in rows and columns. In this conventional flash memory, as is typical, rows of memory cells correspond to those memory cells sharing a common word line, and as such each row defines a page, which is the programming unit for the device. As discussed above, the physical page defined by a word line can correspond to multiple logical pages, for example with even- and odd-numbered cells corresponding to respective logical pages, or with each cell storing upper and lower page data as in conventional MLC arrays. The columns of memory cells share bit lines; in conventional NAND flash memories, as mentioned above, those pages of memory cells that are within the same NAND chains are referred to as a block, which is the erase unit. And, as is also well known in the art, flash memory device 2 may have multiple arrays 10, which are often referred to as "planes" in the memory, such planes being separately (or simultaneously) addressable as one another.

Flash memory device 2 includes control logic circuitry 20, which receives control signals from external terminals as shown, such control signals including chip select signals, latch enable strobes for address, commands, and data, read/write control signals, and the like, as conventional for flash memory devices. External input/output terminals (I/O) receive address, command, and input data for flash memory device 2, and are also used to present output data from flash memory device 2, as conventional in the art. As such, terminals I/O are also connected to control logic circuitry 20, which includes the necessary and appropriate registers for address and command values. Based on such address values as received from terminals I/O, control logic circuitry 20 generates the appropriate signals to row decode 12 for selecting the desired page of flash memory array 11 that is to be addressed. NOR-type flash memories may also include a column decoder (not shown), so that a single byte or bit within the addressed page can be selected.

Data is read from the addressed memory cells by way of row decode 12 selecting a page to be read. In a read operation (indicated by a control signal program/read from control logic 20), sense amplifiers 15 detect the states stored in the cells of the selected page, and forward those data via bus DB to data register 19 for output to terminals I/O, under the control and possible buffering of that data by control logic circuitry 20. Typically, one sense amplifier 15 is provided for each column of array 11, although in some flash memories one sense amplifier 15 may be provided for every two columns, with a single address bit determining which of the pair of columns (i.e., either the odd column or the even column) is to be sensed by that sense amplifier 15 in the read.

A write, or program, operation involves the receipt of data at terminals I/O and the transfer of that data to data register 19 (such transfer often involving buffering of the incoming data within control logic circuitry 20). This input data is forwarded to sense amplifiers 15 over bus DB. Sense amplifiers 15 in turn bias the bit lines of the cells in the selected page that are to be programmed with pulses of the appropriate programming voltages.

Flash memory device 2 performs verification of the programmed cells by row decode 12 applying the appropriate verify control voltage to the memory cells in the programmed page, and sense amplifiers 15 then sensing the state of the cells in that page to determine which cells in the page have been programmed beyond the verify threshold voltage. In this conventional arrangement, sense amplifiers 15 retain the data state that is being programmed to each cell. As such, each of sense amplifiers 15 compares the sensed data state to the desired data state, with sense amplifiers 15 as a group thus perform a bit-by-bit comparison (i.e., an exclusive-OR operation between the programmed state and the desired state) over the entire page. The results of the comparison performed by sense amplifiers 15 are applied to fail bit detector 16.

Fail bit detector 16 effectively counts the number of failed bits in the results forwarded by sense amplifiers 15. For purposes of this verification operation, the term "failed bits" refers to those memory cells that have not yet reached their desired programmed threshold voltage, as sensed by sense amplifiers 15 in response to the verify control gate voltage applied to the word line by row decode 12. For example, if the erased state of a memory cell corresponds to a "1" state (i.e., the threshold voltage of the memory cell is extremely low or negative), the programmed state corresponds to a "0", or sufficiently high threshold voltage as to not turn on with the application of the verify control gate voltage. In this example, therefore, the data state to be programmed in selected memory cells of the currently selected page will be a "0", and those cells that have been sufficiently programmed will have threshold voltages sufficiently high that the devices are off with the application of the verify voltage to their control gates (thus also exhibiting a "0" state). On the other hand, an inadequately programmed cell will still have a low threshold voltage (i.e., below the verify control gate voltage), and will thus conduct (i.e., present a "1" level) upon application of the verify control gate voltage, which will be opposite the desired programmed "0".

In this conventional approach, fail bit detector 16 forwards the number of failed bits over the entire currently sensed page to control logic circuitry 20. As described above, in some applications, control logic circuitry 20 determines whether to apply an additional programming pulse by comparing this number of failed bits in the page against an "ignore bit" limit for the page. The ignore bit limit depends on the error correction coding of the data; if more memory cells than desired have not yet been sufficiently programmed (i.e., more failed bits than the ignore bit limit), programming continues. This iterative sequence continues either until the page is sufficiently programmed (i.e., the number of failed bits is below the ignore bit limit), or until a selected maximum number of programming loops have been performed, in which case the page is marked as unusable if too many cells in that page have not yet been adequately programmed. Also as described above, in other applications, programming is performed until all cells are verified as having reached their desired state, or until a specified maximum number of programming pulses have been carried out, following which the number of failed bits counted by fail bit detector 16 is compared against the ignore bit limit, to determine whether the page is usable after this programming operation.

As known in the art, this verification process is also useful in erasing a block of memory cells in flash memory array 11, considering that erasure requires the application of relatively high voltages to the memory cells, and is also generally performed in an iterative sequence of pulses. As mentioned above, however, the block is the typical erase unit, with each block having multiple pages (e.g., the number of pages corresponding to the number of cells in the NAND chain, for NAND flash memory). A similar operation as described above is performed to verify adequate erasing of the cells in the block (in effect, by sensing the number of columns within the block having cells that are not yet fully erased), with another iteration of the erase pulses applied if cells remain to be erased. In addition, a so-called "soft" programming operation may also be performed, to slightly program cells that have been erased so that deeply erased cells do not cause errors in other cells, for example by program disturb. The verify operation after such "soft" programming can be performed over an entire block, as described above, to ensure that the cells remain erased, but yet have threshold voltages within a "window" above that of deep erased cells. For multi-level programming cells (MLC), the programming sequences are repeated at different levels (sometimes referred to as "upper pages" and "lower pages"), to more precisely define a particular programming threshold level within the MLC constellation. Of course, verify operations are also repeated in this repeated programming operation, to ensure programming of the selected cells to within the desired threshold voltage window for the data state to be stored.

FIG. 2b illustrates the architecture of another conventional flash memory device, an example of which is described in commonly assigned U.S. Pat. No. 6,972,993 B2, issued Dec. 6, 2005 and incorporated herein by this reference. In addition to the capability of verifying programmed and erased states during the programming and erasing of its memory cells, as described above, additional circuitry is provided within flash memory device 2' to verify programmed data states by way of read operations after such programming and erasing.

In this example, the data flow of flash memory device 2', in a write or program operation, involves the receipt of data at terminals I/O, and the eventual transfer of that data to master data register 19 (such transfer often involving buffering of the incoming data within control logic circuitry 20). This input data is forwarded to slave data register 17, with a copy maintained in data compare register 18 (thus permitting master data register 19 to receive a next set of input data). As described in the above-incorporated U.S. Pat. No. 6,972,993 B2, by way of example, verification of the programmed cells is effected by row decode 12 applying the appropriate verify control voltage to the memory cells in the programmed page, and sense amplifiers 15 then sensing the state of the cells in that page to determine which cells in the page have been programmed beyond the verify threshold voltage. The sensed states for the cells in that page are stored in slave data register 17, while data compare register 18 retains a copy of the desired data to be programmed, as mentioned above. Slave data register 17 and data compare register 18 each forward their stored contents to comparator circuit 22, which performs a bit-by-bit comparison (exclusive-OR) of the two contents, forwarding the results to control logic circuitry 20. Control logic circuitry 20 then determines whether the number of cells in the programmed page that have failed verification exceed the ignore bit limit.

In some conventional flash memory applications, the program-and-verify operation is iteratively performed after each programming loop, until all of the cells being programmed in the page pass the verification. However, the counting of failed bits may not be performed until the terminal number of programming cycles is reached, because the fail bit count can be quite time consuming, if performed in every verify operation. In other, typically more advanced, flash memory applications, the counting of failed bits is not performed until a certain number of program-and-verify loops have been completed, because it is unlikely that the ignore bit limit will be met at that point. After that certain number of program-and-verify loops, the fail bit count operation is included with verification, for use in the decision of whether to continue programming the page.

Those skilled in the art will recognize that the increasing density of flash memory cells has resulted in very long word lines, with up to on the order of 32k or more memory cells sharing a word line, and thus residing within the same page. Besides the desire to increase the capacity of a flash memory integrated circuit, it is desirable to include as many cells within a page to save time during programming. As evident from the above description, programming of flash memory cells can be a time consuming process, especially when verify operations are involved in the iterative programming of a page. However, the programming operation programs the cells within a page in parallel, so that a higher degree of parallelism (more cells per page) will improve the efficiency of the programming process.

On the other hand, host systems that utilize flash memory communicate in smaller units of data, for example by storing and retrieving "sectors" of data, analogously (or identically) in the same manner as accessing conventional magnetic disk drives. Because typical sector sizes are on the order of 512 bytes plus overhead (and plus ECC bits), flash memory pages typically include multiple sectors of data. FIG. 3 illustrates the arrangement of a conventional multi-sector page of data in flash memories. In this example, page 8 of FIG. 3 includes four sectors $10_0$ through $10_3$. Each sector 10 includes data portion 3, for storing user data or other data, such as the data generated by an application executing on a host system and communicated to the flash memory for storage. Header portion 5 stores control information for its sector, such control information including identifying information for its associated sector, and status information regarding the data in its associated data portion 3. ECC bit portion 4 stores the ECC or parity bits that are generated from the data in data portion 3 (and also possibly including header portion 5), and that are used in decoding the contents read from sector 10 to correct for any bit errors in that data. As evident from FIG. 3, in which each sector 10 includes its own ECC bit portion 4, error correction decoding is performed on a sector-by-sector basis in conventional flash memories. This error correction is convenient and useful because the sector is the desired unit of data transfer to and from the host system. For example, a typical number of bits correctable within a sector of 512 bytes, using a BCH or Reed-Solomon code is four.

BRIEF SUMMARY OF THE INVENTION

It has been discovered, in connection with this invention, that the conventional approach to verification of programming and erase states as described above relative to FIGS. 2*a* and 2*b* is inefficient in ensuring sufficiently few bit failures per sector. For example, considering a 2112 byte page 8 such as shown in FIG. 3 in which four sectors 10 of data are stored, four bits per sector 10, and thus sixteen bits over the page, are correctable by the application of typical Reed-Solomon or BCH codes to each sector 10. Theoretically, therefore, sixteen verification failures could be tolerated in verification of the programming of a page. However, in conventional circuitry such as the example shown in FIGS. 2*a* and 2*b*, the verification comparison performed by comparator circuit 22 counts the number of failed bits within the page, regardless of bit position. Because it is possible that all failed, or slow-to-program or defective, memory cells may be concentrated within a sector, the maximum number of bits that can be ignored in programming (or erase) verification over a page must be kept below the number of correctable bits per sector. In the example of FIG. 3, therefore, the maximum number of bits that can be ignored over the page is limited to four, despite the ability of error correction to correct up to four bits per sector, and thus sixteen bits over the entire page. Typically, in these conventional flash memories, the maximum number of bits that can be ignored is even lower, for example two bits, to ensure that some error correction capacity remains to correct other bit errors, such as those due to read disturb or data retention failures.

The inefficiency in this arrangement, as discovered according to this invention, is that in many cases the slow-to-program or defective memory cells are not concentrated within a sector. In the example of FIG. 3, one slow-to-program or defective memory cell may reside in each sector 10. In such cases, the programming and erase cycles are extended far beyond what is necessary for reliable operation (i.e., two or three inadequately programmed memory cells within each sector may be correctable). It is further contemplated, according to this invention, that this inefficiency will only grow substantially worse as the manufacturing and other technology advances enable even longer word lines, resulting in flash memory pages of eight, sixteen, or more sectors.

It is therefore an object of this invention to provide a method of operating flash memory circuitry for verifying programmed and erased conditions in a manner that improves the efficiency of error correction coding.

It is a further object of this invention to provide such a method that enables earlier termination of programming and erase operations.

It is a further object of this invention to provide such a method that enables enhanced scaling of flash memory page sizes to include additional sectors, with modest error correction coding capacity.

It is a further object of this invention to provide such a method that is more tolerant of slow-to-program or defective memory cells within a given page, thus improving the manufacturing yield for a given technology and manufacturing process, and without reducing device reliability.

Other objects and advantages of this invention will be apparent to those of ordinary skill in the art having reference to the following specification together with its drawings.

The present invention may be implemented into a method of verifying memory cell states in a flash memory, in which the flash memory is organized into programming units (pages) that each contains multiple host data units (sectors). For each of the sectors within a programmed page, the number of memory cells within that sector that have not been adequately programmed (or erased, in an erasing operation) are determined; a threshold level of number of bits to ignore is defined for each sector, and becomes the termination criterion for the programming (or erasing) of that sector. Upon each of the sectors in the page reaching their termination criterion, the programming (or erasing) operation is terminated. By controlling the number of ignored bits within each sector in this manner, the number of slow-to-program (or erase) or defective memory cells can be increased for a given error correction coding capacity, thus reducing the duration of programming (or erasing) sequences.

DETAILED DESCRIPTION OF THE INVENTION

This invention will be described in connection with its preferred embodiment, namely as implemented into a flash memory device, for example a flash memory device including multi-level programming cells (MLC) arranged in NAND fashion. However, it is contemplated that this invention may also be beneficial if applied in other types of memory architectures and devices. It is contemplated that such other alternative realizations are within the scope of this invention. Accordingly, it is to be understood that the following description is provided by way of example only, and is not intended to limit the true scope of this invention as claimed.

Figure 2A:
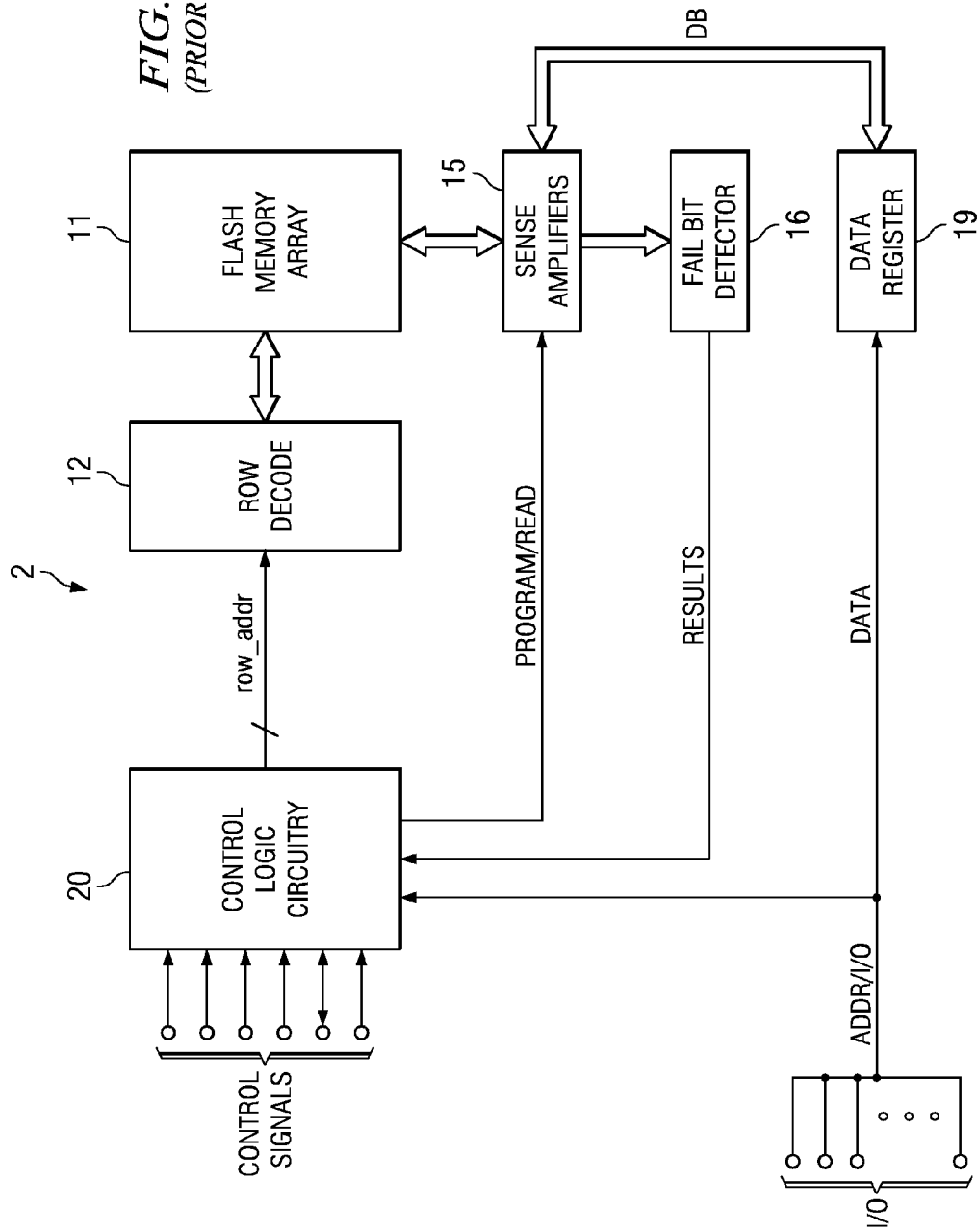
FIGS. 2a and 2b are electrical diagrams, in block form, of conventional flash memory devices including fail bit detection circuitry.
Figure 4:
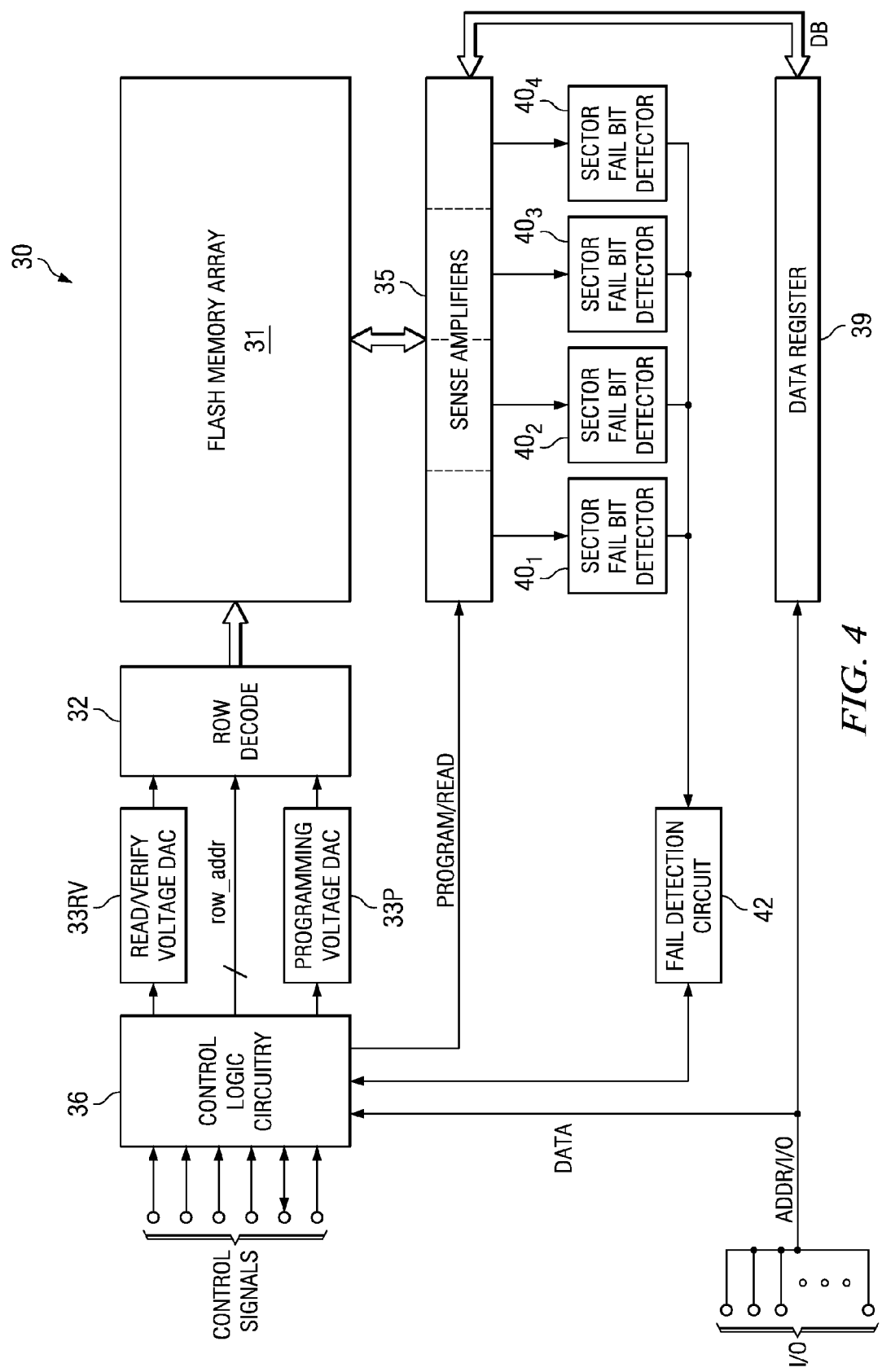
FIG. 4 is an electrical diagram, in block form, of a flash memory device constructed according to the preferred embodiment of the invention.

FIG. 4 illustrates an example of the architecture of flash memory device 30 according to the preferred embodiments of the invention. The construction of flash memory device 30 is similar, in many respects, as that of conventional flash memory devices such described in FIG. 2a. As such, flash memory device 30 includes flash memory array 31 of non-volatile memory cells, realized for example as floating gate metal-oxide-semiconductor (MOS) transistors arranged in rows and columns. In this preferred embodiment of the invention, each row of memory cells is defined as those memory cells sharing a common word line, while each column of memory cells corresponds to those memory cells sharing a bit line (or bit line pair, as the case may be). In flash memory array 31 according to this embodiment of the invention, word lines are driven by row decode 32, and are connected to the control gate of each of the memory cells in their respective rows. As such, each row of array 31 defines a page, which is a programming unit for flash memory device 30. In a NAND flash memory, the columns of memory cells that share a common bit line or bit line pair include those memory cells that are connected in series in a NAND chain, as known in the art. Columns of array 31 may include more than one NAND chain, with additional select transistors provided to select one NAND chain in the column, and conversely to isolate unselected NAND chains from the bit lines. Additionally, flash memory device 30 may have multiple arrays 31, or memory "planes". One or more address bits may be used to select among such multiple planes, or alternatively the planes may be simultaneously addressed by the same address value to store and access a multiple bit data word.

The operation of flash memory device 30 is controlled by control logic circuitry 36. In the conventional manner, control logic circuitry 36 is in communication with an external controller, by way of its external terminals for receiving (and presenting, as the case may be) control signals including chip select signals, read/write control signals, and the like, as conventional for flash memory devices. In flash memory device 30 of FIG. 4, external input/output terminals (I/O) receive address, command, and input data, and also present output data. The control of whether these I/O terminals are receiving an address, a command, or input data (in a write operation) is effected by way of latch enable signals included within the control signals to control logic circuitry 36. For example, an address latch enable strobe presented to flash memory device 30 indicates that a valid address value is present on terminals I/O, a command latch enable strobe indicates a command value, and a data latch enable strobe indicates input data at those terminals; in a read operation, data presented on terminals I/O by flash memory device 30 is synchronous with the data latch strobe. Terminals I/O are coupled to control logic circuitry 36, which includes the necessary and appropriate registers for address and command values. From the viewpoint of an external flash memory controller, flash memory device 30 operates responsively to the command, address, and data signals, and the corresponding control signals, in a similar manner as conventional flash memory devices. In this sense, therefore, control logic circuitry 36 applies the appropriate address values and control signals to row decode 32, so that the desired page or pages of flash memory array are addressed for the desired operation.

Row decode 32 may be constructed in the conventional manner for row decoder circuitry, to decode a binary address presented by control logic circuitry 36 into selection of one or more word lines in flash memory array 31. Row decode 32 effects this selection by applying the desired control gate voltage to the selected word line or lines, and by applying the appropriate unselected voltage level to the other word lines in array 31. During this operation, appropriate select and unselect voltages are applied to the select gates of the selected and unselected blocks, respectively. The specific voltages applied to the word lines, as well as to the bit lines, in memory array 31 are generated by programming voltage digital-to-analog converter (DAC) 33P that generates programming voltages applied to row decode 32. Similarly, read/verify voltage DAC 33RV generates the control gate voltage levels applied by row decode 32 in read and verify operations. The analog output voltages generated by DACs 33P, 33RV are controlled by digital control signals from control logic circuitry 36, and are preferably based on regulated voltages generated by band-gap voltage reference circuits (not shown) within flash memory device 30. It is contemplated that DACs 33 or such voltage generator circuitry as used in flash memory device 30 can be readily implemented, according to conventional techniques, by those skilled in the art having reference to this specification, in a manner best suited for a particular implementation and manufacturing technology.

On the column side of array 31, flash memory device 30 includes sense amplifiers 35, which are conventional circuits for sensing the state of the bit lines of memory array 31, and thus the cells coupled to those bit lines by the appropriate word lines driven by row decode 32. Also as conventional in the art, sense amplifiers 35 apply the appropriate bias voltages to these bit lines during write, or programming operations; these bias voltages are also generated by circuitry (not shown) for generating the appropriate bias voltages for the various programming operations. As mentioned above, NOR-type flash memories may also include a column decoder (not shown), so that a single byte or bit within the addressed page can be selected; alternatively, if a single sense amplifier 35 serves two columns (e.g., if odd- and even-numbered cells are assigned to different pages), a simple column decoder can be implemented with sense amplifiers 35 to control this selection.

In operation, the particular memory cells in array 31 that are to be read are selected according to an address value derived by control logic circuitry 36 in response to commands and address information presented to terminals I/O. As discussed above, row decode 32 selects the appropriate row or rows in memory array 31 corresponding to a row address presented by control logic circuitry 36 on lines row_addr, by driving the word lines for that row or rows with the appropriate control gate voltage, and by applying appropriate voltages to the select gates for the selected and unselected blocks. The control gate voltage will be at a "read" voltage, so that the threshold voltage of the selected cells in that row (page), as programmed or not, will determine whether the cells conduct. In the read mode (indicated by a control signal on line program/read from control logic 36), sense amplifiers 35 detect whether the selected cells are conducting (i.e., have a threshold voltage below the "read" level applied by row decode 32), and thus sense a logic level corresponding to that "read" level. In the MLC context, this read operation is performed, for the selected cells, at multiple control gate "read" voltages so that sense amplifiers 35 can discern among the possible logic states that may be stored. The results obtained by sense amplifiers 35 (either single bit or multiple bit results) are forwarded to data register 39 via bus DB for output to terminals I/O, under the control and possible buffering of that data by control logic circuitry 36.

To program selected memory cells, input data received at terminals I/O are stored at data register 39, under the control of control logic circuitry 36. These data are forwarded from data register 39 to sense amplifiers 35 via bus DB. Sense amplifiers 35 in turn establish the appropriate bit line bias to the particular columns according to the data to be programmed into the page that is selected by row decode 32 based on the row address on lines row_addr.

Figure 1A:
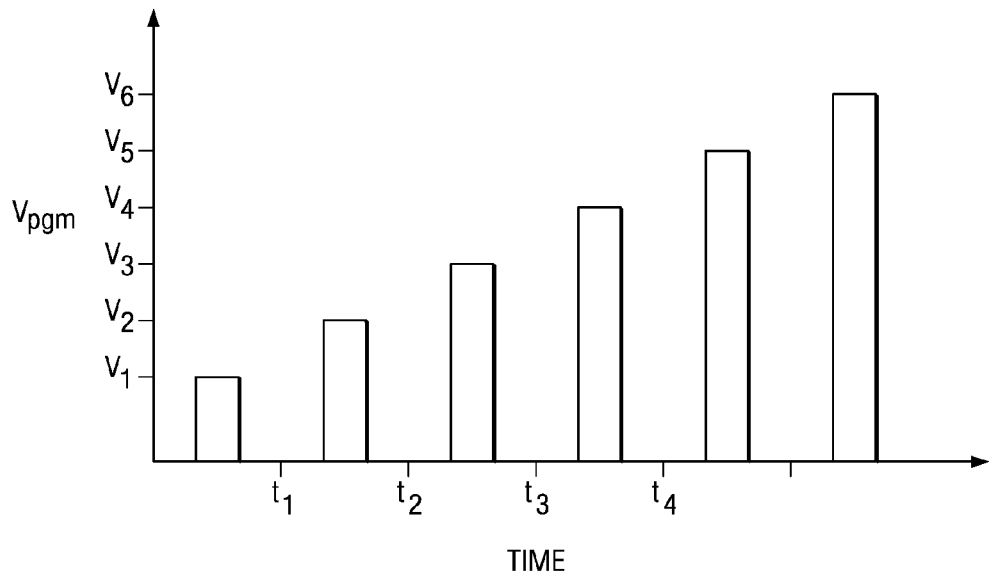
FIGS. 1a and 1b are plots of voltage over time illustrating conventional flash memory program and verify sequences.
Figure 1B:
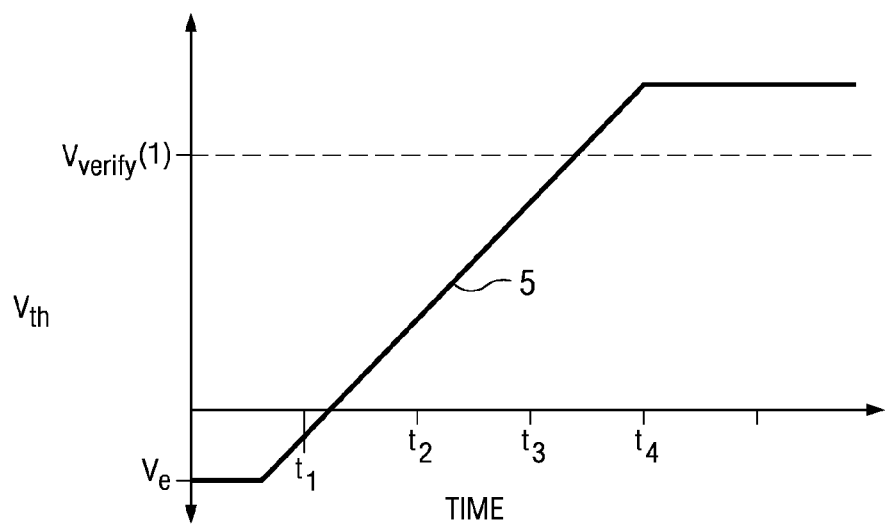

As known in the art, and as described above relative to FIGS. 1a and 1b, the programming of flash memory cells is conventionally performed by applying a sequence of pulses to the cells in the addressed page, with verify operations periodically performed to determine whether individual cells in the page have reached the desired threshold voltage. And, as described above, the programming voltage can be increased during the sequence, assisting the programming of the addressed cells to the desired threshold voltage and data state. In the arrangement of FIG. 4, this increase of the programming voltage is effected by programming voltage DAC 33P, in response to digital control signals from control logic circuitry 36.

As discussed above, two different verification approaches are known, one of which programs the page until all memory cells in the selected page have reached their desired state, or until a terminal number of loops have been applied followed by a comparison of the number of memory cells that have not reached the desired state to an ignore bit limit for the page. The other approach periodically compares the number of memory cells that have not yet reached their desired state against the ignore bit limit to determine whether programming can be terminated. The preferred embodiment of this invention can be used in an analogous manner with each of these approaches, as will be described below.

According to this preferred embodiment of the invention, the verify operation is performed by sense amplifiers 35 in combination with sector fail bit detector circuits 40. To verify the levels in a page being programmed, row decode 32 applies a control gate voltage, at a verify level generated by read/verify voltage DAC 33RV under the control of control logic circuitry 36, to the word line of the page being verified, and applies the appropriate control gate voltages to the word lines of the other pages in array 31 (or at least in the block containing the page being programmed). Sense amplifiers 35 bias the bit lines of the cells in that page (for all cells in that page, whether being programmed or not) to the appropriate read levels. Sense amplifiers 35 sense, for each column, whether the cell in that selected page conducts with its control gate voltage at the verify level. As described above, each of sense amplifiers 35 each also retains the data state to be programmed into its corresponding cell, such that each of sense amplifiers 35 compare the sensed level from the cell against this desired data state, in performing this verify operation.

For example, in the case where programmed cells correspond to a "0" state (the cell transistor having a sufficiently high threshold voltage so that it does not turn on at the read or verify control gate voltage), the desired data state for a cell to be programmed will be a "0", and the desired data state for a cell that is not to be programmed will be "1". A cell that has been sufficiently programmed at the time of the verify operation will have a threshold voltage above the verify voltage, and will therefore not turn on with this verify voltage at its control gate; this cell will exhibit a "0" data state. On the other hand, a cell that is inadequately programmed (or that is not to be programmed at all) will still have a threshold voltage below the verify level, and will conduct (i.e., present a "1" level) upon application of the verify control gate voltage; this cell will return a "1" state to its corresponding sense amplifier 35. This verify occurs over the entire page selected by row decode 32. According to this embodiment of the invention, therefore, sense amplifiers 35 effectively perform bit-wise exclusive-OR operations between the sensed cell state at the verify voltage and the data state to be programmed, over the entire page.

This simplified and generalized single exclusive-OR operation of sense amplifiers 35 in this verify operation directly applies to binary flash memories (i.e., each cell storing either a "0" or a "1"), or to those MLC flash memories in which each of the potential MLC levels is individually programmed and verified. Alternatively, sense amplifiers 35 may be constructed to perform MLC verify operations for its associated cells being programmed. Such MLC sensing and verifying circuitry is known in the art, with an example described in commonly assigned and copending U.S. patent application Ser. No. 10/314,055, now published as U.S. Patent Application Publication No. 2004/0109362, incorporated herein by this reference.

As mentioned above, the counting of the number of "fail" bits, or slow-to-program or defective memory cells, as performed in flash memory 30 according to the preferred embodiment of the invention, can be performed at various times within the overall program-and-verify sequence. According to one approach, the number of slow-to-program or defective memory cells are periodically counted during the program-and-verify loops, and compared with a threshold value (the ignore bit limit) in the manner described below, with programming terminating upon the number of such cells reaching or falling below the ignore bit limit. Alternatively, according to this preferred embodiment of the invention, a page of data is programmed by repeated sequences of programming pulses until all memory cells on that page verify to the desired programmed state, or until a maximum number of programming pulses is reached. If the maximum number of pulses are applied with some cells not yet adequately programmed, the number of the slow-to-program or defective memory cells within the sectors of that page are counted and compared with the ignore bit limit, in the manner described below.

Figure 3:
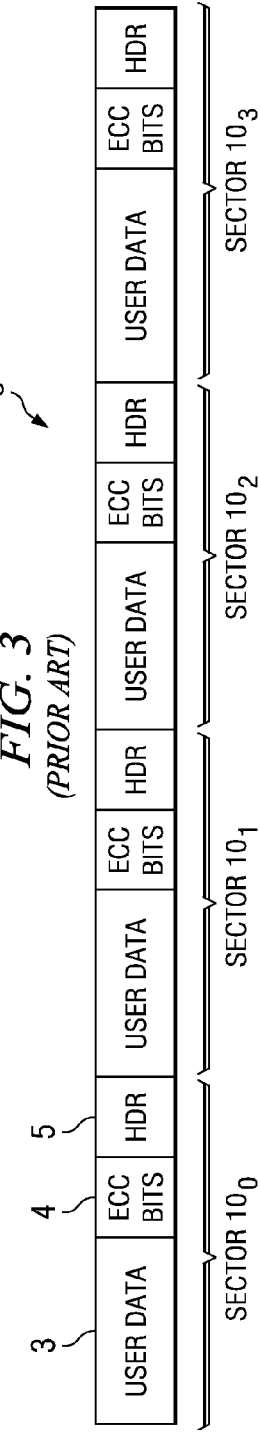
FIG. 3 is a diagram illustrating the arrangement of data, parity bits, and header information for a multi-sector page within a conventional flash memory.

According to this embodiment of the invention, at such time as a determination of the number of fail bits is performed, the results of the bitwise exclusive-OR (or cell-wise MLC comparison, as the case may be) performed by sense amplifiers 35 are forwarded, on a sector-by-sector basis, to corresponding sector fail bit detector circuits 40. In the example of FIG. 4, in which four sectors are contained within each page (as shown in FIG. 3), those sense amplifiers 35 associated with the first sector forward their results to sector fail bit detector circuit $40_1$, those sense amplifiers 35 for columns associated with the second sector of the page forward their results to sector fail bit detector circuit $40_2$, and so on for all four sector fail bit detector circuits $40_1$ through $40_4$.

Each of sector fail bit detector circuits 40, according to this embodiment of the invention, derives a count of the number of failed bits as sensed by sense amplifiers 35 associated with its respective sector of the page being programmed. In this example, in which sense amplifiers 35 effectively perform an exclusive-OR of the sensed and desired data states, each sector fail bit detector circuit 40 counts the number of "1" logic levels presented by its associated sense amplifiers 35. As such, each sector fail bit detector circuit 40 may be constructed as combinational logic for deriving such a count, as a binary counter that counts "1" levels from sequential polling of its associated sense amplifiers 35, or in such other manner as appropriate for deriving a count of the failed bits as sensed by its sense amplifiers 35. It is contemplated that those skilled in the art will be readily able to construct sector fail bit detector circuits 40 as appropriate for a given implementation, without undue experimentation.

Each of sector fail bit detector circuits 40 generates a signal, such as an encoded digital data word, that represents the number of failed bits detected from its associated sense amplifiers 35, and forwards this result signal to fail detection circuit 42. Fail detection circuit 42 forwards the results from all of the sector fail bit detection circuits 40 to control logic circuitry 36, for use in determining the next step to be performed in the programming operation, as will be described in detail below.

In the example of FIG. 4, fail bit detection circuit 42 receives the signals from each of sector fail bit detection circuits 40, through $40_4$, and generates a signal to control logic circuitry 36 responsive to those results. For example, fail bit detection circuit 42 may include the appropriate logic circuitry for comparing the results from each sector against an "ignore bit" threshold value or limit (which is communicated to fail bit detection circuit 42 from control logic circuitry 36, for example), and then indicating the ultimate result (i.e., all sectors pass, or one or more sectors fail) to control logic circuitry 36. Alternatively, fail bit detection circuit 42 may forward an indication for each sector regarding whether that sector meets the criterion, or even the number of failed bits for each sector, to provide a more instructive result to control logic circuitry 36. Further in the alternative, the functions of fail bit detection circuit 42 may be incorporated into control logic circuitry 36 itself such that control logic circuitry 36 directly receives and processes the results form each of sector fail bit detection circuits 40, through $40_4$. It is contemplated that those skilled in the art having reference to this description will be readily able to arrange the functions of fail bit detection circuitry 42 for specific realizations, without undue experimentation.

Figure 5:
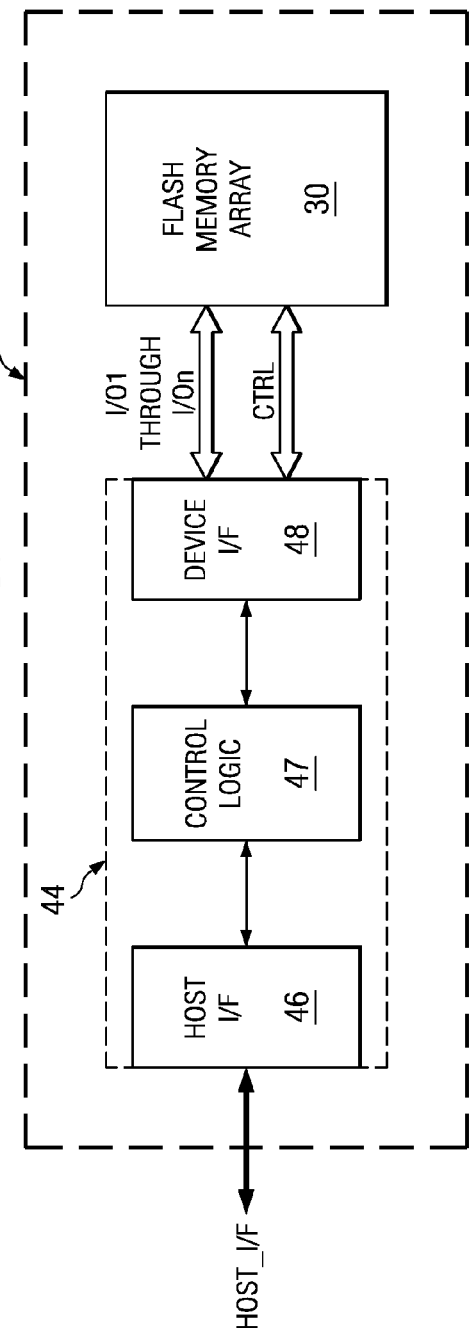
FIG. 5 is an electrical diagram, in block form, of a flash memory card including flash memory device 30 constructed according to the preferred embodiment of the invention.

Referring to FIG. 5, the implementation of flash memory device 30 into flash memory card 45 will be described. As known in the art, flash memory is often manufactured and used in the form of a flash memory card, in which both the flash memory device and a flash memory controller are implemented; in other forms, the physical flash memory card does not include a memory controller, relying instead on the control functions being executed by the host system. In this example, flash memory card 45 includes controller 44, which includes host interface circuitry 46 that couples to the host system by way of host interface bus HOST_IF. Controller 44 also includes device interface circuitry 48, which communicates with flash memory device 30 over input/output lines I/O1 through I/On, connected to terminals of the same name at flash memory device 30, and by way of control bus CTRL, which provides and receives control signals to and from control logic circuitry 36 of flash memory device 30 as described above.

Controller 44 also includes control logic 47, which performs numerous functions in the control of the operation of flash memory device. From a hardware standpoint, as mentioned above, it is contemplated that control logic 47 will be constructed in the conventional manner, preferably by way of a programmable processor executing instructions sequences stored in program memory. As known in the art, the functions preferably performed by control logic 47 include the sequencing and transfer of sectors of data to and from flash memory device 30, and media management functions that organize the logical data storage within the block and page structure of flash memory device 30. More specifically, control logic 47 preferably includes address translation functions that arrange and sequence the transfer of data between the host system and flash memory device 30, according to the mapping of logical sector addresses to physical addresses. Control logic 47 also preferably manages flash memory device 30 by way of several tables, including free block tables, indices and tables used in maintaining the obsolete or updated status of blocks within flash memory array 31, and manages erased blocks in flash memory array 31, by maintaining erase count and implementing wear leveling techniques. Control logic 47 also preferably executes error correction coding (ECC) operations, including the encoding of data to be written or programmed into flash memory device 30, and the decoding of read data communicated from flash memory device 30. The particular ECC code used by control logic 47 can be any one of the known error correcting codes known in the art and suitable for flash memory. Examples of suitable codes include the well-known Reed-Solomon code, and other BCH and systematic codes.

Figure 6A:
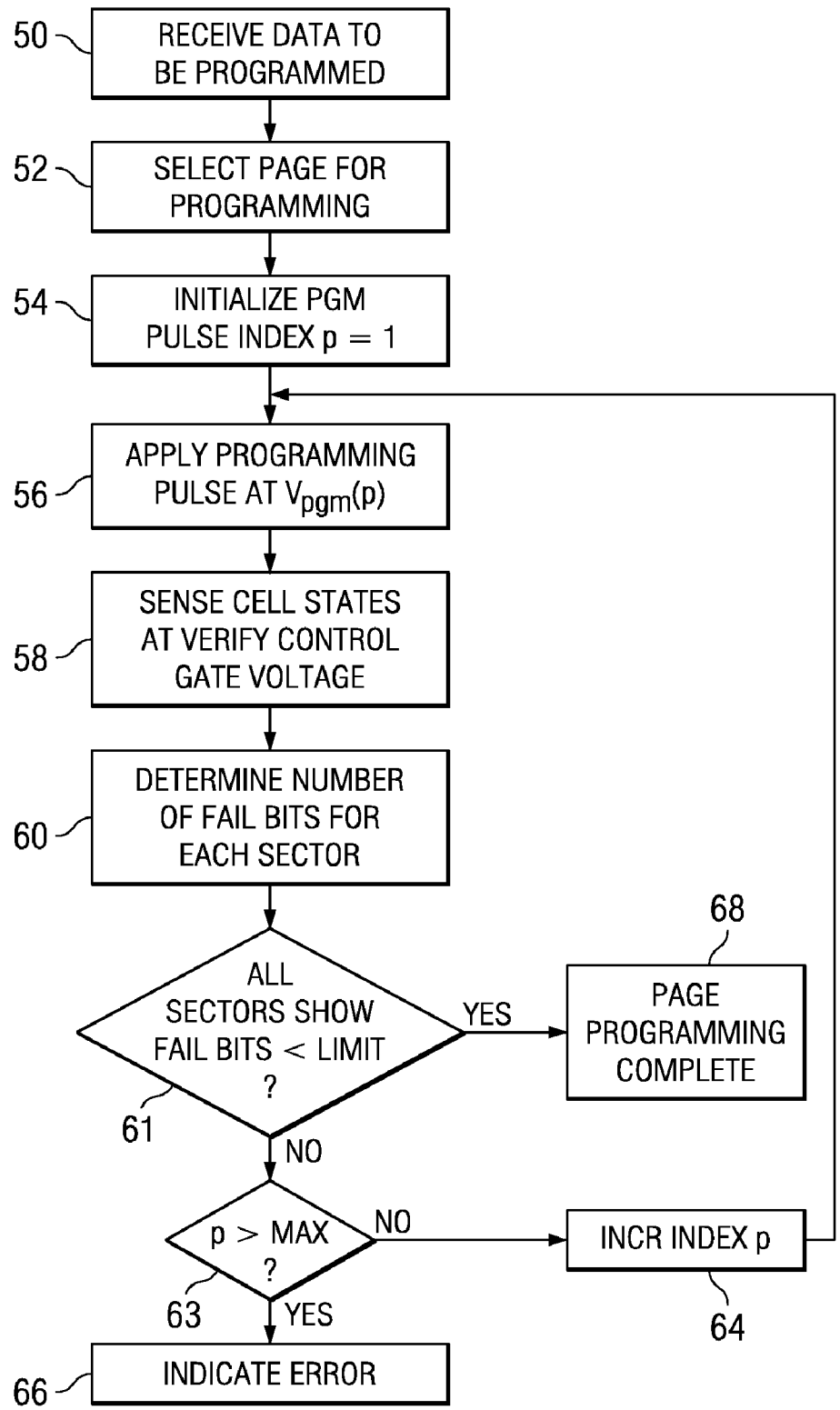
FIGS. 6a and 6b are flow diagrams illustrating the operation of the flash memory device of FIG. 4, according to the preferred embodiments of the invention.

Referring now to FIG. 6a, the operation of flash memory device 30 in performing a write of data received from a host system, according to this preferred embodiment of the invention, will now be described. It is contemplated that this sequence of operations is substantially executed by control logic circuitry 36, in combination with the other functional circuits of flash memory device 30. It is further contemplated that those skilled in the art having reference to this specification will be readily able to realize control logic circuitry 36, either as custom hardware, as programmable logic executing a sequence of program instructions, or a combination of the two, so as to perform the operations described in this specification, without undue experimentation.

According to this approach, the number of slow-to-program or defective memory cells are counted periodically during the program-and-verify loops, with programming terminating upon the number of such cells reaching or falling below the ignore bit limit. As such, the operation of FIG. 6a begins, in process 50, with the receipt of the input data to be programmed from the host system. It is contemplated that a controller in a flash memory subsystem or card will receive this input data, and will format that data into the desired arrangement (e.g., as shown in FIG. 3) as appropriate for the particular size of a page, or programming unit, in flash memory device 30. In this regard, the data received in process 50 will be arranged in multiple sectors, or other data units (e.g., "chunks") within the page to be programmed. Preferably, according to this embodiment of the invention, this data includes the ECC or parity bits associated with the data for each sector in the page. And, in process 52, control logic circuitry 36 derives a physical address for the page to be programmed, and applies the appropriate signals on lines row_addr to row decode 32 to select the page to be programmed.

The programming operation itself begins in process 54, in which a loop index p is initialized to p=1, in this example. In process 56, the first programming pulse or sequence of pulses is applied to the word line of the page selected in process 52, and thus to the control gates of the memory cells in array 31 associated with that page. According to this preferred embodiment of the invention, in which the programming voltage applied to the control gates increases with each programming loop or iteration, the voltage of the first programming pulse is at its lowest voltage $V_{pgm}(1)$ in this first instance of process 56. Also, in this process 56, the bit lines for those cells that are to be programmed are held at ground by sense amplifiers 35, and the bit lines for those cells that are not being programmed are held at a high voltage. The selection of which cells in the page are to be programmed and which are not is determined by the input data received from the host system and stored in data register 39.

In process 58, a verify operation is performed by sense amplifiers 35 in association with row decode 32. According to the preferred embodiment of the invention, row decode 32 applies a verify voltage to the word line, and thus to the memory cell control gates, at a level corresponding to the desired verify level for the data state being programmed. As described above, in this verify process 58, sense amplifiers 35 compare the sensed state of each of its cells against the desired data state being programmed for that cell, and generates a digital value for each cell in the page indicating whether the cell has been sufficiently programmed to the desired verify level so far. For example, in a binary flash memory, this digital value generated by each of sense amplifiers 35 may correspond to the exclusive-OR of the sensed data state at the verify voltage and the desired data state. Those cells that are not to be programmed (i.e., those cells in the page that are to remain erased) will, of course, match their desired (unprogrammed) data state, absent a manufacturing defect or other hard failure mechanism.

After the sensing of the cells in the programmed page and the generation of the verify result by sense amplifiers 35 in process 58, the verify results are forwarded to sector fail bit detection circuits 40$_1$ through 40$_4$. In process 60, each sector fail bit detection circuit 40$_1$ through 40$_4$ determines the number of failed bits within its associated sector of the page being programmed. Specifically, sector fail bit detection circuit 40$_1$ determines the number of failed bits within the first sector as sensed by sense amplifiers 35, sector fail bit detection circuit 40$_2$ determines the number of failed bits within the second sector as sensed by sense amplifiers 35, and so on. The failed bit counts determined by each of sector fail bit detection circuits 40 are forwarded to fail detection circuit 42, in the example of flash memory device shown in FIG. 4.

It may be desirable to repeat programming process 56 a selected number of times before process 60 (and also, perhaps, process 58) is first performed for the page being programmed, relying on characterization results that indicate that a certain number of programming pulses may always be necessary. In this way, the time required to perform process 60 (and process 58) may be saved, by not performing those operations before a reasonable chance of success exists.

Following process 60, fail bit detection circuit 42 and control logic circuitry 36 (or either of these circuits) then execute decision 61, to determine whether all of the sectors in the page being programmed show fewer fail bits than the ignore bit limit for those sectors. According to the preferred embodiment of the invention, each sector has an ignore bit limit, preferably based on the level of error correction coding applied to that sector. For example, if error correction coding is capable of correcting up to four bit errors in a sector, each of the four sectors in the page of FIG. 3 may have an ignore bit limit as high as four bits. Preferably, the ignore bit limit per sector is reduced from the maximum correctable number of bits, to ensure that other errors such as those due to read disturb, data retention failure, or other mechanisms can also be corrected. For example, a sector in which four bits may be corrected may have an ignore bit limit, for programming, of two bits. Accordingly, in decision 61, fail bit detection circuit 42 determines whether any of the sectors has a higher number of failed bits than the ignore bit limit for that sector.

If any of the sectors has more failed bits (i.e., due to insufficiently programmed memory cells) than its sector-level ignore bit limit, decision 61 returns a NO result; this result is communicated to control logic circuitry 36, in the example of FIG. 4. Control logic circuitry 36 then executes decision 63 to determine whether a maximum number of programming loops have been performed, by comparing loop index p against this maximum value. If at least one sector of the page being programmed has more failed bits than its ignore bit limit, and if the maximum number of programming loops has been reached (decision 63 is YES), control logic circuitry 36 concludes that the current page being programmed cannot be programmed due to the presence of too many slow-programming or defective memory cells, excessive wear, or some other failure mechanism. In process 66, control logic circuitry 66 indicates this error condition, for example by communicating the address of the failed physical page to the flash memory controller so that a logical-to-physical address map can be updated and this page avoided in future writes. The programming of this selected page then terminates.

If decision 63 determines that the maximum number of programming loops has not been reached (decision 63 returns a NO result), then additional programming will be applied to further program the selected page. Loop index p is incremented (process 64), and control returns to process 56 in which another programming pulse or sequence of pulses is applied to the word line for the selected page being programmed. As known in the art, those cells that are already sufficiently programmed may be "locked out" from further programming, for example by sense amplifiers 35, so that overprogramming of those cells does not occur. This "locking out" of sufficiently programmed cells is especially useful in MLC flash memory, as it keeps the threshold voltage distribution for a given MLC level as tight as possible. Typically, this next instance of process 56 will apply a slightly higher programming voltage $V_{pgm}(p)$ (e.g., increased by 0.2 to 0.5 volts from the previous instance), in the conventional manner. Programming and verify processes 56, 58, and fail bit detection and comparison processes 60, 61, are then repeated for this next instance.

Upon an instance of the programming loop resulting in none of the sectors having more failed bits than their individual sector-level ignore bit limits, decision 61 returns a YES result. This result indicates indicate that the page is now sufficiently programmed. Control passes to process 68, in which control logic circuitry 36 performs such housekeeping operations to complete the programming process for this page.

Figure 6B:
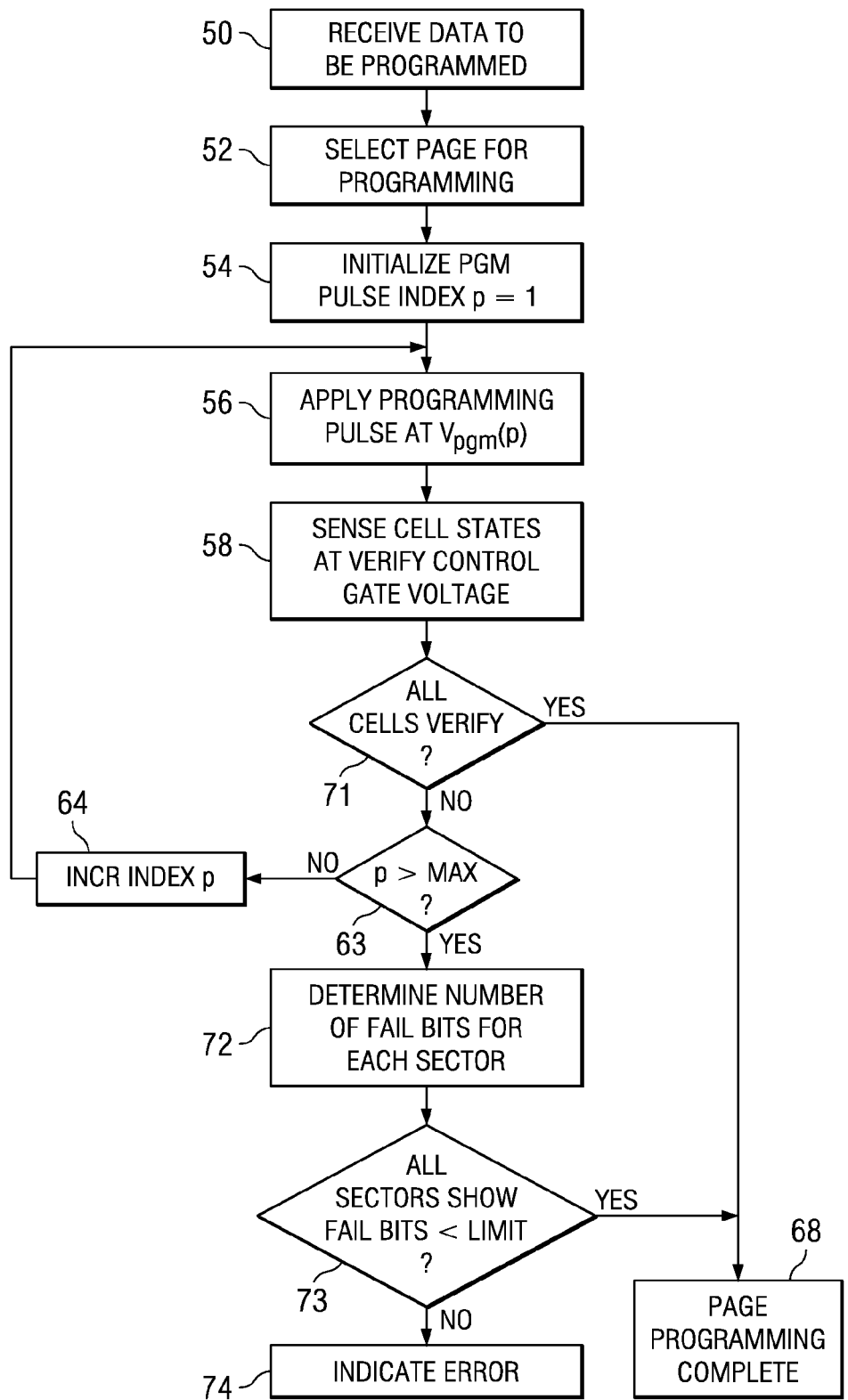

FIG. 6b illustrates the operation of flash memory 30 constructed according to the preferred embodiment of the invention in connection with an alternative programming approach. According to this approach, as mentioned above, the number of slow-to-program or defective memory cells within each sector of a multi-sector page are counted, and compared with the ignore bit limit, after the terminal number of programming pulses are performed.

As shown in FIG. 6b, processes 50 through 58 are performed as described above relative to FIG. 6a, such that a selected page has one or more programming pulses applied thereto according to received input data; process 58 is performed to verify the states of the programmed cells, as described above. According to this alternative approach, decision 71 determines whether all of the programmed cells verify to their desired state, for example by performing an exclusive-OR of the bit-wise exclusive-OR comparison performed by sense amplifiers 35, as described above. If all cells are successfully programmed at this time (decision 71 is YES), the programming of the page is complete (process 68). On the other hand, if not all cells verify to their desired state (decision 71 is NO), decision 63 compares the current value of programming pulse index p against its maximum, or terminal, value; if additional programming pulses may be applied (decision 63 is NO), programming pulse p is incremented in process 64, and the program and verify operations of processes 56, 58 are repeated.

If the number of programming pulses performed on the selected page has reached its maximum value (decision 63 is YES), and because at least one cell has not yet been adequately programmed (decision 71 is NO), the number of fail bits per sector is determined in process 72. As described above, process 72 is performed by each sector fail bit detection circuit 40, through $40_4$ determining the number of failed bits within its associated sector of the page being programmed, and forwarding its failed bit counts to fail detection circuit 42. Fail bit detection circuit 42 and control logic circuitry 36 (or either of these circuits) then executes decision 73 to determine whether all of the sectors in the page being programmed show fewer fail bits than their associated ignore bit limits. If any of the sectors has more failed bits (i.e., due to slow-to-program or defective memory cells) than its associated ignore bit limit, decision 61 returns a NO result, which is communicated to control logic circuitry 36, in the example of FIG. 4. According to this approach, however, because the terminal number of programming loops have been applied (decision 63 is YES), this page of flash memory 30 is deemed to be unusable, as it cannot be programmed to a level of accuracy sufficient for error correction coding; in process 74, therefore, control logic circuitry 36 issues an error signal, and preferably communicates the address of the failed physical page to the flash memory controller so that this page is avoided in future writes. The programming of this selected page then terminates.

On the other hand, if all of the sectors of the currently selected page have fewer slow-to-program or defective memory cells than their sector ignore bit limit (decision 73 is YES), the page is successfully programmed, and the programming sequence is complete (process 68). To the extent that slow-to-program or defective memory cells are present within each sector, the resulting failed bits can be readily corrected by the error correction coding applied to the sectors.

Figure 2B:
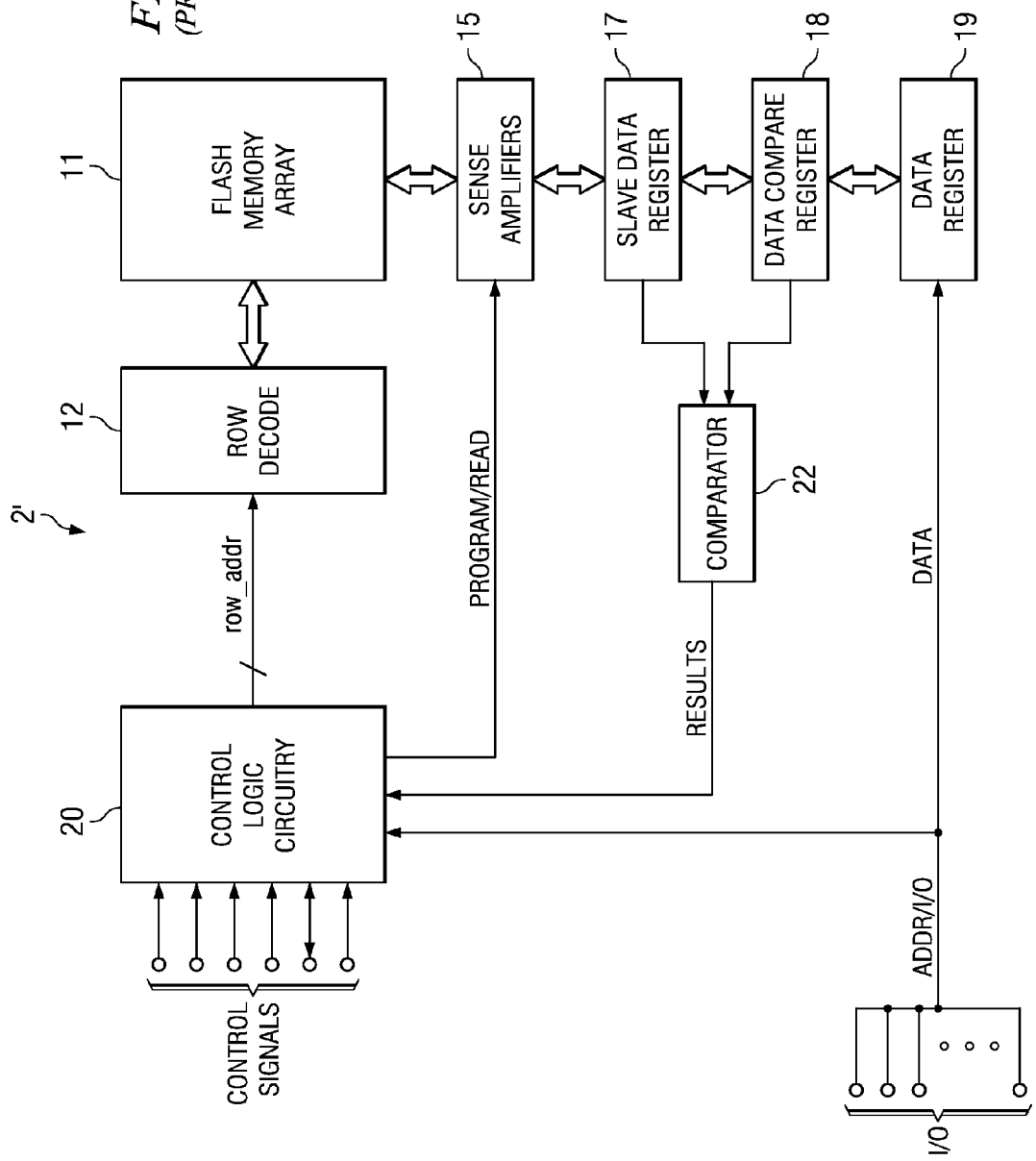

According to either of these approaches as applied to this preferred embodiment of the invention, as evident from the foregoing description, the number of failed, or insufficiently programmed, memory cells is determined on a sector-by-sector basis in each programming loop. This granularity in the fail bit detection process not only optimizes the programming operation, but also causes the error correction coding to be much more efficient than in conventional flash memories such as described above in FIGS. 2a and 2b.

As discussed above, error correction coding is performed on a sector-by-sector basis, such that the ECC or parity bits for a sector are derived only from that sector, and do not depend on the data (or coding) of other sectors. As such, the decoding of the data bits is performed on individual sectors, consistent with the manner in which the host system communicates data to be stored in flash memory device 30. As discussed above, the sector-level ignore bit limit for a sector may be as high as four bits, if error correction coding can correct up to four bits within the sector. In that case, programming of the memory cells in that sector need only continue until four or fewer failed bits remain, for the sector.

Assuming the same error correction coding for all four sectors in the page, therefore, according to this preferred embodiment of the invention, each of the four sectors may therefore have as many as four failed bits during programming, because error correction coding as applied to each sector able can correct those four errors. In this example, programming may stop upon reaching as many as sixteen failed bits, if those failed bits are distributed so that no more than four failed bits reside in any sector.

As discussed above, it is contemplated that the actual ignore bit limit will be kept below the error correction capability within a sector, so that some robustness remains in case of read or sensing errors. For the example of four bit error correction per sector, a preferred ignore bit limit is therefore one or two bits per sector, according to this embodiment of the invention.

In contrast, the conventional flash memories as described above relative to FIGS. 2a and 2b perform the verification over the entire page at a time. In these conventional memories, as described above, the ignore bit limit for the page must be selected assuming the worst case, in which all failed bits reside in the same sector. Accordingly, for a four sector page, the ignore bit limit for the page must be four or less to ensure that error correction can compensate for such incomplete programming.

It is therefore contemplated that this invention will substantially improve the manufacturing and test yield of flash memory devices, and also their usability and effective storage capacity, without degrading device reliability in the least. This is because the number of slow-to-program or defective memory cells within a page that would cause that page to be deemed unusable, according to conventional page-wise verification and failed bit count, are not necessarily unusable according to the preferred embodiment of the invention, if the slow-to-program or defective memory cells are distributed among the multiple sectors within the page. In other words, for a given random distribution of failures over a flash memory array, the sector-wise verification and failed bit count approach of this invention will result in more usable pages, and thus a higher yield of usable flash memory devices, as compared with the conventional technique. And because the sector ignore bit limits are set with reference to the capability of the error correction coding to be applied, the preferred embodiment of the invention can realize this yield and usability gain without degrading the device reliability apparent to the user.

In addition, with reference to the method of operation described above relative to FIG. 6a, the number of programming loops that are required to reduce the number of slow-to-program memory cells will generally be reduced, according to the preferred embodiment of the invention, relative to the number of loops required in conventional flash memories, for a given error correction capability. This programming efficiency can be attained without any degradation in device reliability, as discussed above. This invention also enables the device designer to take advantage of the improved granularity by reducing the error correction capability (and thus the number of additional memory cells per page required for storing parity or ECC bits), if so desired.

The operation of flash memory device 30 according to this preferred embodiment of the invention may also be applied to other operations besides the programming of input data. As known in the art, verify operations are also conventionally performed in erase operations, to ensure that each memory cell in the block being erased (or at least a sufficient number of cells in that block) is sufficiently erased to the extent that their threshold voltages are below a desired level.

As known in the art, the erase of a block of cells in memory array 31 is typically effected by row decode 32 biasing the word lines (and control gates) of the selected block to a low voltage, typically at ground, while biasing the P-well in which the memory cells are located to a very high voltage, which causes electrons accumulated in the floating gate to tunnel back to the channel region (i.e., the P-well) of the memory cell transistor. According to this implementation of this invention, the processes of FIG. 6a or 6b can be analogously used to verify this erasing of memory cells. As discussed above, however, erase verify operations in NAND flash memory differ from program verify operations because the verify is typically performed with all word lines in the block being biased to the verify voltage (which is preferably at a non-negative voltage, despite the erase threshold voltage being negative, by adjusting the source line biasing, as mentioned above). Of course, other erase verify operations are also known and useful in connection with this invention.

In this erase verify operation, sense amplifiers 35 and sector fail bit detection circuits 40 determining how many columns in each sector, simultaneously over all pages in the block, contain cells that are not yet sufficiently erased. Those skilled in the art will comprehend that, in this erase verify operation, any insufficiently erased cell in the NAND chain will block conduction through the chain, and will be evident at sense amplifiers 35. If too many columns in a sector contain insufficiently erased cells, an additional erase operation is then applied to that block containing that sector. This process thus ensures proper erasure of cells in each sector, of each page, of the erased block. The ignore bit limit for erasure may be at the same value as used in programming (i.e., assuming the same error correction capability), or may be varied therefrom as desired.

In addition, the sector-wise fail bit detection of this preferred embodiment of the invention may also be used in connection with the verifying of "soft" programming. "Soft" programming refers to the programming of erased cells in a block, after an erase operation, to slightly raise the threshold voltages of the erased cells. As known in the art, some cells in a block will be erased more deeply than others, due to manufacturing variations or different wear history of the cells. This results in a wide threshold voltage distribution among the erased cells, which may cause program disturb during subsequent programming operations. As such, the soft programming of each of the cells in an erased block, toward a threshold voltage closer to the limit between erased and programmed, tightens the threshold voltage distribution of the erased cells in a block, and facilitates subsequent programming. This soft programming is performed in similar fashion as the programming of input data to a page in memory array 31 as described in FIG. 6, with the exception that, typically, all cells in each page of the block are soft-programmed in the same operation; of course, other soft-programming methods are also known in the art and may be used in connection with this invention. The verification of soft programming is performed similarly as described above for erase verify operations, with all word lines in the block verified at once. The sector-wise fail bit detection provided by this invention is also preferably used in connection with such soft programming, to reduce the number of soft programming loops while still ensuring that the error correction coding for each sector can robustly correct any errors that may result.

Other alternative and additional implementations of this invention are also contemplated. For example, it is contemplated that the fail bit detection within a page need not be carried out in connection with individual sectors, but may be performed on pairs of sectors, or other data block sizes within the page. Indeed, the number of memory cells included in a fail bit detection determination need not correspond to the same sector or other data group over which error correction is performed in memory accesses. Referring to FIG. 4 by way of example, two fail bit detection circuits may be provided rather than four such circuits, with each fail bit detection circuit determining the number of failed bits over two sectors; of course, this grouping of multiple sectors would not achieve the maximum benefit of this invention. Further in the alternative, fail bit detection for the data bits within a sector (or other grouping of memory cells) separately from the fail bit detection for the parity bits for that sector or group.

Further in the alternative, the fail bit detection of this invention may be used in flash memories in which the sense amplifiers do not themselves perform the verify comparison (and thus issue a pass/fail indication), but rather in which the sense amplifiers issue a signal corresponding to the data level sensed. In such an architecture, the fail bit detection may be implemented by providing a slave data register, for each sector, that stores the sensed data states from the sense amplifiers, and comparator circuitry that compares, for each sector's data, the contents of the slave data register with the input data for that sector (e.g., as stored in the data register or in another buffer).

It is contemplated that these and other implementations of this invention may be readily realized by those skilled in the art having reference to this specification, and that such implementations are within the scope of this invention as claimed. As such, while the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of programming a page of flash memory cells in a flash memory device, the page of flash memory cells including a plurality of groups of memory cells, the method comprising the steps of:
   receiving input data to be programmed into a selected page;
   applying a programming pulse, at a first programming voltage, to control gates of memory cells of the selected page, according to the input data;
   applying a verify control gate voltage to the memory cells of the selected page;
   sensing the state of each of the memory cells in the selected page; and
   for each of the plurality of groups of memory cells:
      determining, for each of the memory cells in the group, whether the programmed state matches the input data value for that memory cell; and
      counting a number of memory cells in the group for which the programmed state does not match the input data value;
      comparing the counted number against an ignore bit limit.

2. The method of claim 1, further comprising:
   comparing a number of repetitions of the applying and sensing steps against a maximum limit; and
   responsive to the number of repetitions reaching the maximum limit and the counted number of at least one of the groups of memory cells not being below the ignore bit limit, indicating a programming error.

3. The method of claim 1, further comprising:
   responsive to the counted number for any of the groups of memory cells not being below the ignore bit limit, repeating the applying and sensing steps.

4. The method of claim 3, further comprising:
   prior to each instance of repeating the step of applying a programming pulse, increasing the programming voltage.

5. The method of claim 3, further comprising:
   prior to repeating the applying steps, biasing each of the memory cells in the page having a programmed state that does match the input data value to not be further programmed in the repeated applying steps.

6. The method of claim 1, further comprising:
   selecting an ignore bit limit for each of the groups.

7. The method of claim 6, wherein a first plurality of memory cells associated with each of the groups of each of the pages corresponds to a data portion;
   wherein a second plurality of memory cells associated with each of the groups of each of the pages corresponds to a parity bit portion;
   and wherein the number of memory cells in the second plurality of memory cells is selected based on a code that can correct up to a correctable number of errors.

8. The method of claim 7, wherein the ignore bit limit is selected based on the correctable number of errors.

9. The method of claim 8, wherein the ignore bit limit equals the correctable number of errors.

10. The method of claim 8, wherein the ignore bit limit is less than the correctable number of errors.

11. The method of claim 1, wherein each of the groups of memory cells in a page corresponds to a sector of data.

12. The method of claim 1, wherein each of the groups of memory cells in a page corresponds to a plurality of sectors of data.

13. The method of claim 1, wherein each of the memory cells is capable of storing more than two data states.

14. The method of claim 1, wherein the memory cells are arranged in NAND fashion in the array.

15. The method of claim 1, further comprising:
   performing an erase operation on a block of the memory cells, the block of memory cells including a plurality of pages.

16. The method of claim 15, wherein the step of performing an erase operation comprises:
   biasing each of the memory cells in the block to an erase bias condition.

17. The method of claim 15, further comprising, for each of the pages in the block:
   after the step of performing an erase operation, applying a verify control gate voltage to the memory cells of the block;
   sensing the state of each column of memory cells in the block;
   for each of the plurality of groups of memory cells:
      determining, for each column of memory cells in the group, whether all of the memory cells in that column match an erased state; and
      counting a number of columns in the group for which the programmed state does not match the erased state;
      comparing the counted number against an ignore bit limit;

responsive to the counted number for any of the groups of memory cells not being below the ignore bit limit, repeating the step of performing an erase operation.

18. The method of claim 16, further comprising:
responsive to the counted number of all of the groups of memory cells being below the ignore bit limit, terminating the erase operation.

19. The method of claim 17, further comprising, for each page in the block:
applying a soft programming pulse to control gates of the memory cells of the block;
applying a verify control gate voltage to the memory cells of the block;
sensing the state of each column of memory cells in the block; and
and for each of the plurality of groups of memory cells:
determining, for each column of memory cells in the group, whether all of the memory cells in that column match a soft programmed state; and
counting a number of columns of memory cells in the group for which the programmed state does not match the soft programmed state;
comparing the counted number against an ignore bit limit.

\* \* \* \* \*